(12) United States Patent
Nam

(10) Patent No.: US 6,329,706 B1
(45) Date of Patent: Dec. 11, 2001

(54) LEADFRAME USING CHIP PAD AS HEAT CONDUCTING PATH AND SEMICONDUCTOR PACKAGE ADOPTING THE SAME

(75) Inventor: Shi-back Nam, Incheon (KR)

(73) Assignee: Fairchild Korea Semiconductor, Ltd. (KR)

( * ) Notice: Subject to any disclaimer, the term of this patent is extended or adjusted under 35 U.S.C. 154(b) by 0 days.

(21) Appl. No.: 09/644,097

(22) Filed: Aug. 23, 2000

(30) Foreign Application Priority Data

Aug. 24, 1999 (KR) .................................................. 99-35186

(51) Int. Cl.[7] .................................................. H01L 23/495
(52) U.S. Cl. ........................... 257/666; 257/675; 257/676
(58) Field of Search .................................... 257/666, 676, 257/675, 796, 787

(56) References Cited

U.S. PATENT DOCUMENTS

| | | | | |
|---|---|---|---|---|
| 5,757,070 | * | 5/1998 | Fritz | 257/676 |
| 5,847,446 | * | 12/1998 | Park et al. | 257/676 |
| 5,859,387 | * | 1/1999 | Gagnon | 257/676 |

* cited by examiner

*Primary Examiner*—Roy Potter
(74) *Attorney, Agent, or Firm*—Rothwell, Figg, Ernst & Manbeck, pc

(57) ABSTRACT

A leadframe and a semiconductor package adopting the leadframe, capable of effectively preventing moisture intrusion into the semiconductor package, and preventing flashing and reducing thermal stress on a chip pad during a molding process. The chip pad of the leadframe includes: at least two swaged portions; narrow and long grooves on the first and second surfaces thereof, formed in a V-like or U-like shape along the four sides of the chip pad in a rectangular shape; at least one slot formed along the outside of a chip mount area; and wings adjacent to the slots.

19 Claims, 4 Drawing Sheets

LEADFRAME USING CHIP PAD AS HEAT CONDUCTING PATH AND SEMICONDUCTOR PACKAGE ADOPTING THE SAME

BACKGROUND OF THE INVENTION

1. Field of the Invention

The present invention relates to a leadframe and a semiconductor package adopting the same, and more particularly, to a leadframe adopting a chip pad capable of dissipating heat produced by a chip, and a semiconductor package adopting the leadframe.

2. Description of the Related Art

Semiconductor devices are used for processing information or signals, in addition to controlling current or power in electric or electronic circuits. The semiconductor device in controlling current or power consumes a relatively high current or voltage compared to the device for information or signal processing. For this reason, the current or power controlling semiconductor device is referred to as a power device, as distinguished from general semiconductor devices.

Semiconductor packages in which such power devices are embedded produce a large amount of heat, because a high current flows through the semiconductor packages at a high operating voltage. To dissipate heat produced by a chip embedded in such a semiconductor package, a heat spreader or a heat slug is inserted below or attached to a chip mounting pad. Recently, the backside of the chip pad is directly exposed to the outside to dissipate heat, thereby reducing the production cost of semiconductor packages.

Such a technique of exposing the chip pad of the semiconductor package to the outside is described in U.S. Pat. No. 5,594,234 (entitled "Downset Exposed Die Mount Pad Leadframe and Package" and assigned to Texas Instruments Corp. on Jun. 14, 1997), and U.S. Pat. No. 5,440,269 (entitled "Resin-packaged Semiconductor Device with Flow Prevention Dimples" and assigned to Mitsubishi Denki Kabushiki Kaisha on Aug. 8, 1995).

FIG. 1 is a sectional view of a conventional semiconductor package issued to Texas Instruments Corp. Referring to FIG. 1, a chip 39 is attached to a chip pad 31 of a leadframe and molded into a semiconductor package using an epoxy mold compound (EMC) 40. Reference numeral 36 represents leads, reference numeral 31a represents the bottom of the chip pad 31, and reference numerals 34 and 35 represent wings which extend upward and outward from the chip pad 31 so as to increase the moisture path.

However, such a semiconductor package with wings causes flash on the bottom of the semiconductor package during the molding process with a molding material. In other words, the EMC flows over the bottom of the chip pad, so that a linear distinct boundary line cannot be formed between the exposed portion and the sealed portion of the chip pad. As a result, the exposed portion of the bottom surface of the chip pad cannot be formed to have a trim rectangular outline, and instead has an irregular outline because of the flowed molding material. Since the flowed molding material covers the bottom of the chip pad, which serves as the heat conducting path, the heat dissipating effect of the chip pad is lowered. To solve this problem, an additional deflash process must be carried out on the semiconductor package after the molding process is completed. The deflash process means the process of dipping the semiconductor package in a solution to dissolve and remove the unnecessary flowed molding material from the bottom of the chip pad. In addition, such a semiconductor package having the chip pad exposed to the outside is susceptible to thermal stress.

FIG. 2 is a sectional view of another conventional semiconductor package assigned to Mitsubishi Denki Kabushiki Kaisha, and FIG. 3 is a bottom view of the semiconductor package of FIG. 2.

Referring to FIGS. 2 and 3, dimples 25 are formed on the bottom 2b of the chip pad 2a to prevent flashing during molding with a molding material. Also, the edge of the chip pad is completely surrounded with the molding material, which increases the moisture path. However, a step between the bottom 2b of the chip pad 2a and the bottom of the molding material hinder direct contact with a printed circuit board (PCB) 30, and the reduction of the bottom area of the chip pad by the molding material, lowers the heat dissipating efficiency. In FIGS. 2 and 3, reference numeral 3 represents epoxy for attaching a chip 1 to a chip pad 2a, reference numeral 4 represents a gold wire, reference numeral 5 represents an inner lead, reference numeral 6 represents an EMC, reference numeral 7 represents an outer lead, and reference numeral 30 represents a PCB on which the semiconductor package is mounted.

However, the semiconductor package with dimples cannot suppress flashing at non-dimple portions of the semiconductor package, and deteriorates heat dissipating characteristics. In addition, since the chip pad of the semiconductor package directly contacts the PCB, the chip pad is susceptible to thermal stress.

SUMMARY OF THE INVENTION

To solve the above problems, it is an objective of the present invention to provide a semiconductor package adopting a chip pad as a heat conducting path, which can effectively restrict moisture intrusion into the semiconductor package, and effectively prevent flush on the bottom of the semiconductor package during a molding process, and reduce thermal stress caused by heat produced by the chip pad.

It is another objective of the present invention to provide a leadframe for use in the semiconductor package.

The first objective of the present invention is achieved by a semiconductor package comprising: a leadframe including inner lead, outer lead, and a chip pad, the outer leads being correspondingly connected to the inner leads of the leadframe, extending out of the semiconductor package, the chip pad having a first surface on which a chip is mounted, and a second surface which is opposite to the first surface and is partially exposed to the outside of the semiconductor package, a chip mounted on the first surface of the chip pad and sealed by epoxy, gold wires for connecting bonding pads of the chip to corresponding inner leads of the leadframe, and an epoxy mold compound (EMC) covering the first surface of the chip pad and inner leads, but exposing a portion of the second surface of the chip pad. In the leadframe of the semiconductor package, the chip pad comprises: at least two swaged portions formed along edges of the chip pad of the leadframe; a first narrow and long groove formed on the first surface of the chip pad of the leadframe along the edge thereof; a second narrow and long groove formed on the second surface of the chip pad of the leadframe along the edge thereof, not to be covered with the EMC; and at least one slot formed in the chip pad of the leadframe.

Preferably, the swaged portions are formed on the second surface of the chip pad.

Preferably, the second groove on the second surface of the chip pad has a V-like shape or a U-like shape, and is formed to be exposed to the outside of the semiconductor package, along the four sides of the chip pad in a rectangular shape.

Preferably, the first groove on the first surface of the chip pad has a V-like shape or a U-like shape, and is formed along the outline of a chip mount area on the first surface of the chip pad in a rectangular shape.

Preferably, the plurality of slots are formed in the chip pad of the leadframe surrounding a chip mount area, and the plurality of slots are separated from each other, and wings are formed near the slots in the chip pad of the leadframe, by bending upward and outward a portion of the chip pad. The wings near the at least one slot in the chip pad of the leadframe may be adjacent to a chip mount area.

The second objective of the present invention is achieved by a leadframe comprising: a chip pad having a first surface on which a chip is mounted, and a second surface which is opposite to the first surface and is partially exposed to the outside of the semiconductor package; and a plurality of leads extending out from the chip pad, a portion of the leads being molded with an epoxy mold compound (EMC) and the other portion of the leads extending outside a semiconductor package. The chip pad of the lead frame includes: at least two swaged portions along the edge of the chip pad; a narrow and long groove formed along the edge of the second surface of the chip pad to be exposed to the outside of the semiconductor package; and at least one slot formed in the chip pad.

Preferably, the swaged portions are formed on the second surface of the chip pad.

Preferably, the groove on the second surface of the chip pad is formed in a V-like shape or a U-like shape along the four sides of the chip pad in a rectangular shape. Preferably, the leadframe further comprises a narrow and long groove in a V-like shape or a U-like shape on the first surface of the chip pad in a rectangular shape.

Preferably, the plurality of slots are formed in the chip pad of the leadframe surrounding a chip mount area, being separated from each other. Wings may be formed near the at least one slot in the chip pad of the leadframe, by bending upward and outward a portion of the chip pad. The wings near the at least one slot in the chip pad of the leadframe may be adjacent to a chip mount area.

Therefore, in the semiconductor package according to the present invention, the chip pad of the leadframe can serve as a heat conducting path, and moisture intrusion into the semiconductor package can be effectively prevented. In addition, spreading of flash over the bottom of the semiconductor package during a molding process using a molding material can be prevented. Furthermore, thermal stress on the chip pad due to heat generated from a chip can be reduced.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings, in which preferred embodiments of the invention are shown. The novel feature of the present invention lies in the chip pad of a leadframe, and the configuration of the leadframe will be described along with a semiconductor package adopting the leadframe. In addition, the term "slot" is used to refer to holes through the chip pad, and the term "groove" is used to refer to recessions from the top or bottom of the chip pad which do not penetrate the chip pad.

Figure 1:
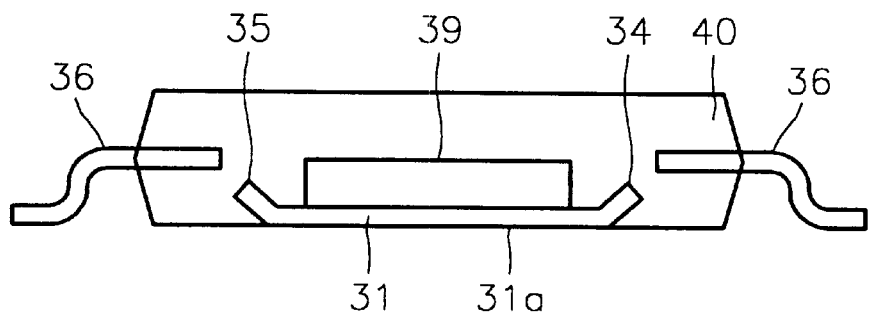
FIG. 1 is a sectional view of a conventional semiconductor package adopting a chip pad whose bottom is exposed to the outside.
Figure 2:
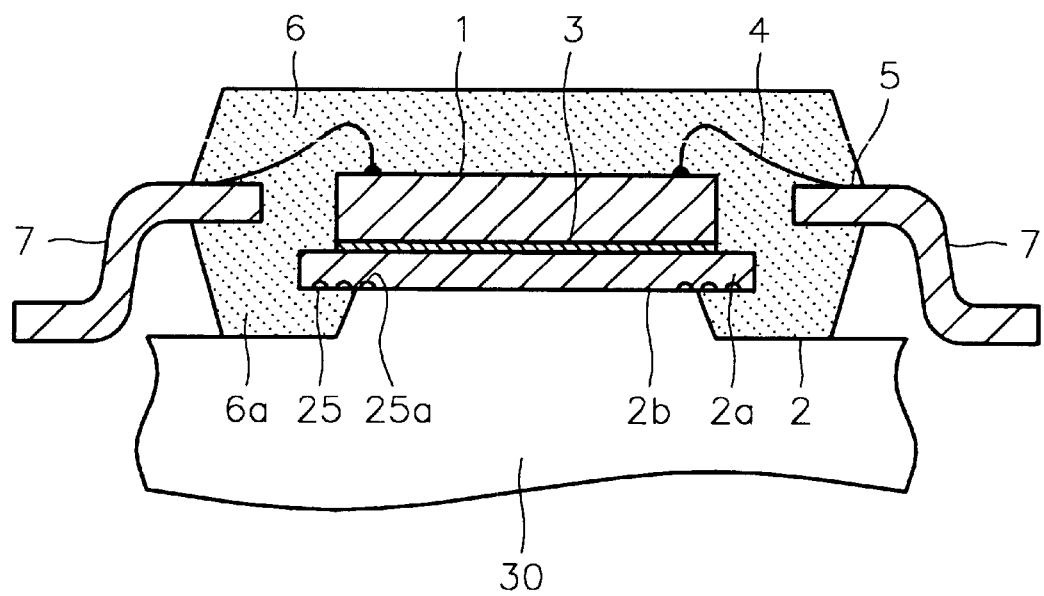
FIG. 2 is a sectional view of another conventional semiconductor package adopting a chip pad whose bottom is exposed to the outside.
Figure 3:
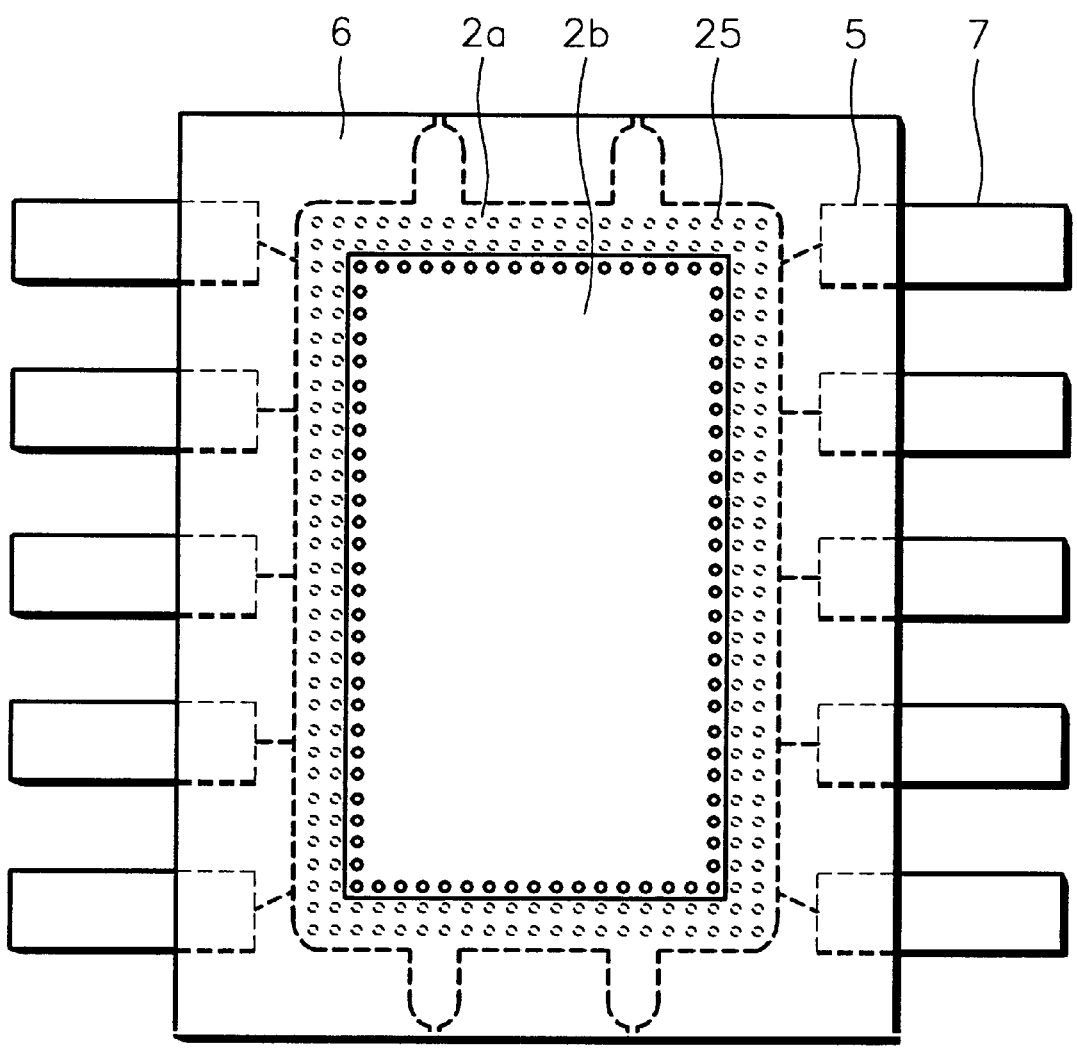
FIG. 3 is a bottom view of the semiconductor package shown in FIG. 2.
Figure 4:
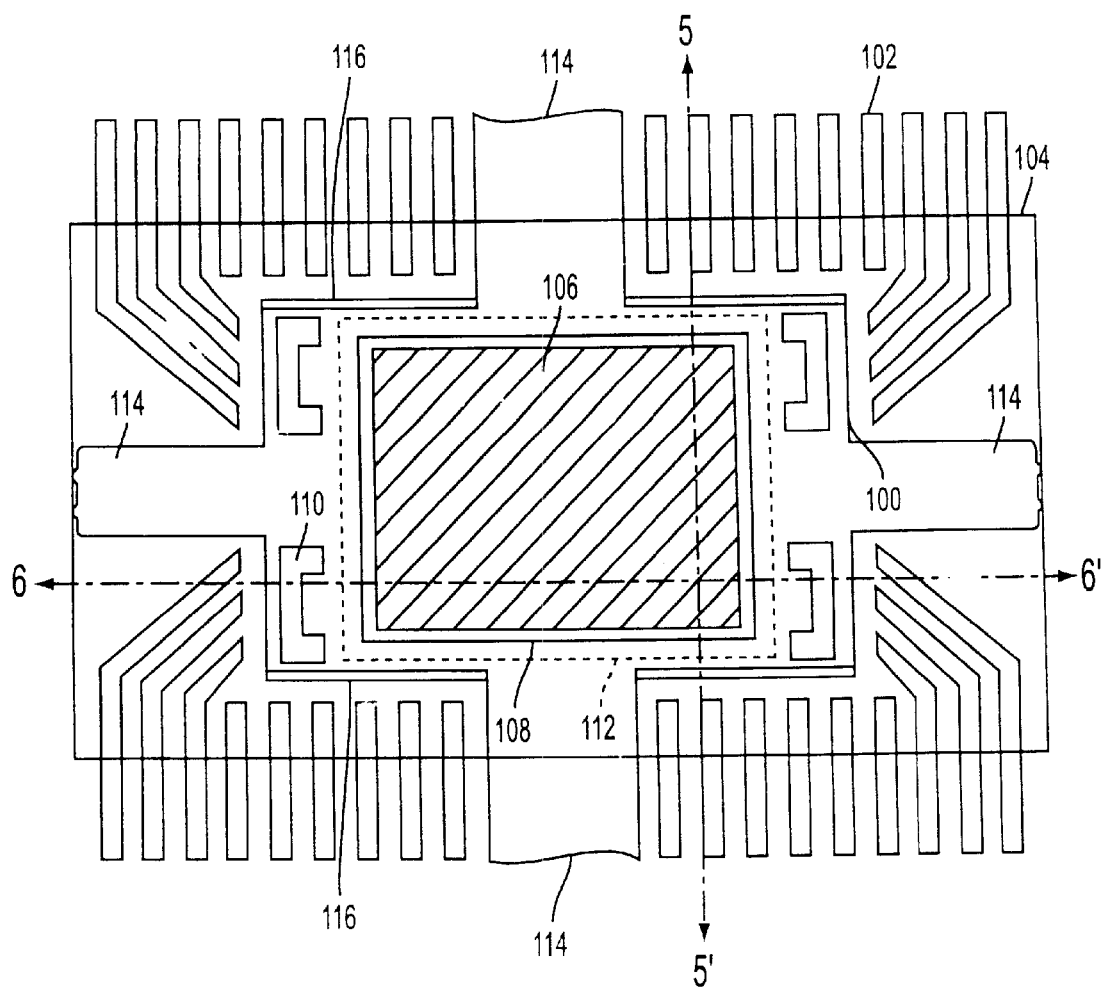
FIG. 4 is a plan view of a semiconductor package with a leadframe according to the present invention.

FIG. 4 is a plan view of a semiconductor package according to the present invention. Referring to FIG. 4, the semiconductor package according to the present invention, which adopts a chip pad acting as a heat conducting path, includes: a leadframe with a chip pad 100; a chip 106 attached to a first surface, i.e., the top surface, of the chip pad 100 using epoxy; gold wires (not shown) for connecting bonding pads of the chip 106 to corresponding inner leads of the leadframe; an epoxy molding compound (EMC) 104 covering the first surface of the chip pad and the inner lead, but exposing a portion of a second surface, i.e., the bottom surface, of the chip pad; and outer leads 102 which are just extensions of the inner leads of the leadframe outside of the completely molded semiconductor package. Inner leads refer to the portion completely molded with the EMC 104, whereas outer lead 102 refer to the portion not molded by the EMC 104, extending out of the molded structure. Reference numeral 114 represents tie bars for holding the chip pad 100 in place within the leadframe.

In the semiconductor package according to the present invention, the bottom of the chip pad 100 is exposed to the outside as a thermal conductive path, and the chip pad of the leadframe has the following features.

First, the chip pad 100 has swaged portions 116 on at least two sides thereof. In the present embodiment, as shown in FIG. 4, the swaged portions 116 are formed on the upper and lower sides of the chip pad 100 in the lateral direction. In FIG. 4, a swaging process is carried out on the second surface of the chip pad 100. The swaging process involves stamping the edge of the second surface of the chip pad 100 using a stamping punch. As a result of this swaging process, the edge of the chip pad 100 is deformed into a more complicated shape, which will later be described with reference to an enlarged view thereof. In addition, the moisture penetration path also becomes complicated after the swaging process, which increases the reliability of semiconductor packages in terms of moisture protection. Furthermore, the swaged portions 116 make the attachment of the EMC 104 to the leadframe more rigid, and relieve the edge of the chip pad 100 from thermal stress. Although the preferred embodiment is described with reference to the swaging process on only two sides of the chip pad 100, all four sides of the chip pad 100 can be subjected to the swaging process. For reference, thermal stress on the chip pad 100 is commonly concentrated on the edge of the chip pad 100.

Second, the chip pad 100 of the leadframe has a narrow and long groove. The narrow and long groove may be formed on either the first surface of the chip pad 100, which is designated with reference numeral 108, or the second surface of the chip pad 100, which is designated with reference numeral 112. In the present embodiment, the grooves are formed on both the first and second surfaces of the chip pad 100. The narrow and long grooves 108 and 112 are formed in a U-like or V-like shape, forming a rectangular loop along the edge of the leadframe. Two or more grooves can be formed on each surface of the leadframe, which further enhances moisture protection and the adhesion of the EMC 104 to the semiconductor package.

In a conventional semiconductor package, a means capable of blocking moisture from penetrating into the semiconductor package is not adopted, or discontinuous dimples are formed to prevent moisture penetration. Meanwhile, the narrow and long grooves 108 and 112 are formed to be continuous along the edge of the chip pad 100 in a rectangular shape around the chip mount area on the first and second surfaces, respectively, of the chip pad 100, which deters moisture from intruding into the package. In contrast to conventional packages, the semiconductor package adopting a configuration as described can operate without deterioration of performance due to moisture intrusion, even when it is placed in conditions favorable for moisture penetration. In addition, the narrow and long grooves 108 and 112 contribute to making the attachment of the EMC 104 to the leadframe more rigid.

Third, the chip pad 100 has at least one slot 110. In the present embodiment, as shown in FIG. 4, four separate slots 110 are formed at the corners of the chip pad 100. The formation of the slots 110 in the chip pad 100 further relieves thermal stress on the chip pad 100. Although the slots 110 are formed to have a C-like shape in the present embodiment, the shape of the slots 110 may be varied. A portion of the chip pad 100 adjacent to the slot 110 is bent upward and outward from the bottom of the chip pad 100 to form wings close to the chip mount area of the leadframe. The formation of wings will later be described with reference to the sectional view of FIG. 5.

Figure 5:
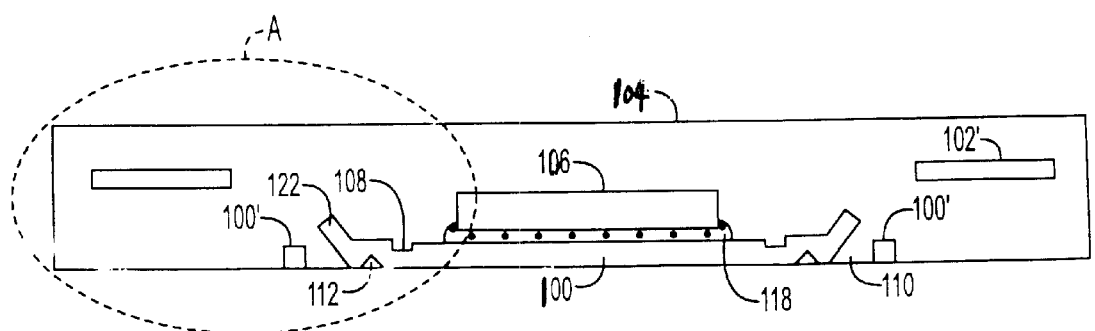
FIG. 5 is a sectional view taken along line 5–5' of FIG. 4.

FIG. 5 is a sectional view taken along like 5–5' of FIG. 4. Referring to FIG. 5, the slots 110 are shown passing through the chip pad 100. Also, wings 122 extending upward and outward from the chip pad 100, which are formed by bending a portion of the chip pad 100 close to the slot 100, are shown adjacent to the chip mount area of the leadframe. Also, the narrow and long grooves 112 are shown formed in a V-like shape on the second surface of the chip pad 100, and the narrow and long grooves 108 are shown formed in a U-like shape on the first surface of the chip pad 100. The wings 122 contribute to increasing the moisture path, and the U-shaped narrow and long groove 108 formed in the first surface of the chip pad 100 can prevent moisture intrusion with reliability at the final stage. The semiconductor package according to the present invention is superior in preventing moisture from contacting the semiconductor, even in the most moisture abundant conditions, compared to conventional packages. In FIG. 5, reference numeral 102' represents inner leads, reference numeral 118 represents epoxy for attaching the chip 106 to the chip pad 100, and reference numeral 100' represents a portion of the chip pad 100 isolated by the slots 110.

Figure 6:
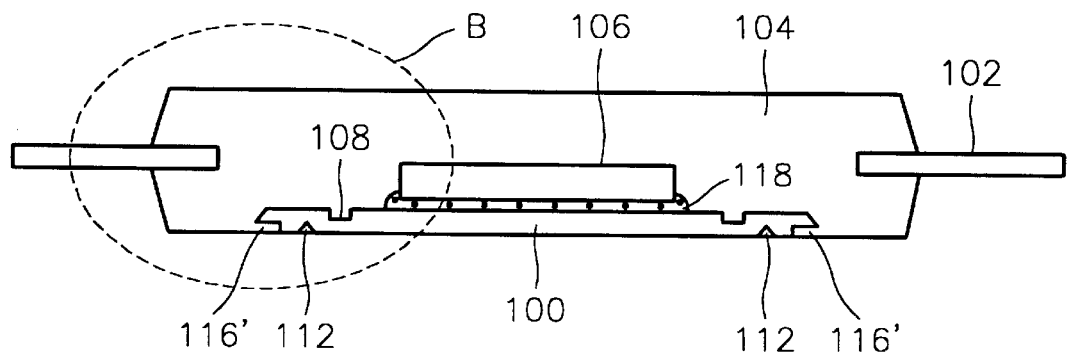
FIG. 6 is a sectional view taken along line 6–6' of FIG. 4.

FIG. 6 is a sectional view taken along like 6–6' of FIG. 4. Referring to FIG. 6, a swaged portion 116' is shaped on the second surface of the chip pad 100 by stamping the edge of the chip pad 100 using a stamping punch. Preferably, the depth of the swaged portion 116' is 0.175 mm or more for a leadframe having a thickness of 0.254 mm. The edge of the chip pad 100, which was initially cut at a right angle, is slightly extended as shown in FIG. 6 by the force of the stamping punch. In FIG. 6, the swaged portion 116' refers to the portion directly subjected to the swaging process, and thus it is distinguished from the swaged portion 116 viewed from the opposite side of the swagged portion 116'. Also, the grooves 112 and 108 formed on the second and first surfaces, respectively, of the chip pad 100 have a width of about 0.2 mm and a depth of about 0.05 mm.

Figure 7:
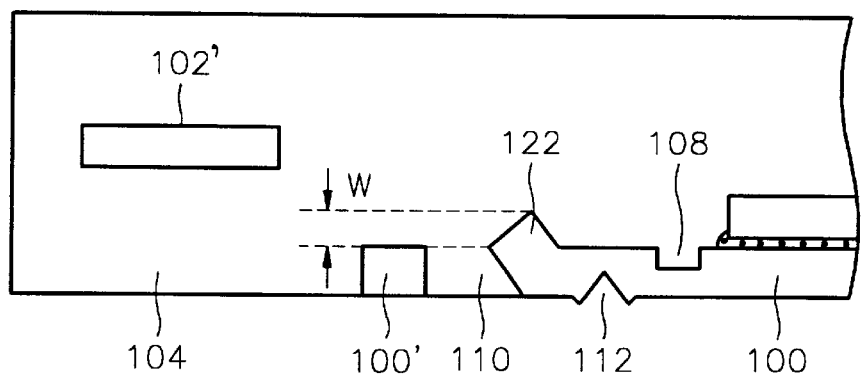
FIG. 7 is an enlarged view of portion A in FIG. 5.

FIG. 7 is an enlarged view of portion A in FIG. 5. Referring to FIG. 7, the wings 122 next to the slots 110 are bent to be higher than the chip pad 100 by about 0.1 to 0.3 mm, which is designated with W, such that a wire bonding process can be smoothly carried out without obstruction by the wings 122. In addition, the V-shaped groove 112 formed in the second surface of the chip pad 100 can prevent flashing during a molding process using the EMC 104, which will be described with reference to FIG. 8.

Figure 8:
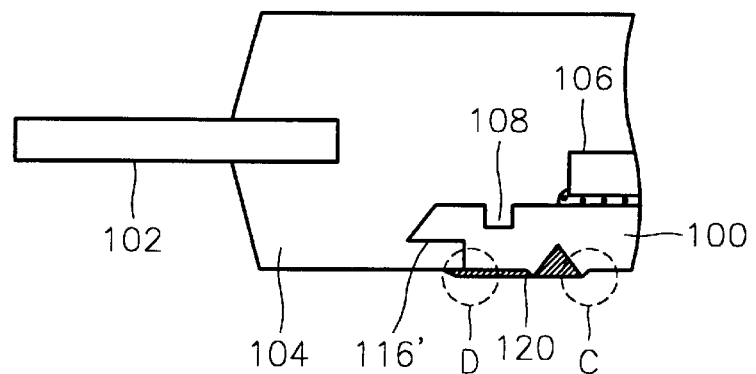
FIG. 8 is an enlarged view of portion B in FIG. 6.

FIG. 8 is an enlarged view of portion B in FIG. 6. Referring to FIG. 8, the grooves 112 and 108 are formed on the second and first surfaces, respectively, of the chip pad 100 by stamping the chip pad 100 using a stamping punch. At this time, the edge of the groove 112 slightly protrudes, as indicated by circle C, as a result of the impact of the punch. Ideally, the EMC 104 must be molded within the region indicated by circle D without intrusion into the V-shaped groove 112. However, the occurence of flash 120 is inevitable during the molding process. If flash 120 occurs beyond the V-shaped groove 112, the portion of the chip pad 100 with a flash cannot be smoothly plated in a subsequent process and the heat dissipating effect through the chip pad 100 is lowered. In order to account for these problems, the conventional technique adopts an additional deflashing process to remove the flash. In addition, another conventional technique intends to suppress the occurrence of flash by forming dimples in the chip pad. However, the occurrence of flash in the portion of the chip pad where dimples are not formed cannot be avoided. In contrast to the conventional technique, the V-shaped groove 112 formed on the second surface of the chip pad 100 blocks the flow of flash beyond the groove 112 with the projection formed by the stamping process for the groove 112. As a result, the flash 120 cannot flow beyond the V-shaped groove 112 as shown in FIG. 8. Thus, flash occurrence distance can be controlled by varying the distance between the swaged portion 116' and the V-shaped groove 112.

In the semiconductor package according to the present invention, the chip pad of the leadframe can itself serve as a thermal conductive path, in addition to providing the following advantages.

First, the narrow and long groove formed in the first surface of the chip pad, the wings of the chip pad, which are formed adjacent to the slots, and the swaged portions along the edge of the chip pad can effectively prevent moisture from intruding into the semiconductor package, thereby improving the reliability of the semiconductor package regarding moisture protection.

Second, the V-shaped groove formed in the second surface of the chip pad can positively prevent flash from spreading on the bottom of the semiconductor package during a molding process. Thus, the deflash process can be eliminated, thereby making the overall process for manufacturing semiconductor packages simple.

Third, the slots and the swaged portions of the chip pad can effectively disperse thermal stress to the chip pad of the semiconductor package.

While this invention has been particularly shown and described with reference to a preferred embodiment thereof, it will be understood by those skilled in the art that various changes in form and details may be made therein without departing from the spirit and scope of the invention as defined by the appended claims. For example, although the preferred embodiment is described with reference to the swaged portions formed in the second surface of the chip pad, the swaged portions may be formed in the first surface thereof. In addition, the shape of the slots may vary, and two or more grooves may be formed in each of the first and second surfaces of the chip pad. Furthermore, the four tie bars of the leadframe in the preferred embodiment can be reduced to two. The shapes of the tie bars and the semiconductor package may be varied. The preferred embodiment is merely illustrative and not intended to limit the scope of the invention.

What is claimed is:

1. A semiconductor package comprising:
   a leadframe including inner lead, outer lead, and a chip pad, the outer leads being correspondingly connected to the inner leads of the leadframe, extending out of the semiconductor package, the chip pad having a first surface on which a chip is mounted, and a second surface which is opposite to the first surface and is partially exposed to the outside of the semiconductor package;
   a chip mounted on the first surface of the chip pad and sealed by epoxy;
   gold wires for connecting bonding pads of the chip to corresponding inner leads of the leadframe; and
   an epoxy mold compound (EMC) covering the first surface of the chip pad and inner leads, but exposing a portion of the second surface of the chip pad;
   wherein the chip pad of the leadframe comprises:
      at least two swaged portions formed along edges of the chip pad of the leadframe;
      a first narrow and long groove formed on the first surface of the chip pad of the leadframe;
      a second narrow and long groove formed on the second surface of the chip pad of the leadframe along the edge thereof, not to be covered with the EMC; and
      at least one slot formed in the chip pad of the leadframe.

2. The semiconductor package of claim 1, wherein the swaged portions are formed on the second surface of the chip pad.

3. The semiconductor package of claim 1, wherein the second groove on the second surface of the chip pad is formed in a V-like shape or a U-like shape.

4. The semiconductor package of claim 1, wherein the second groove on the second surface of the chip pad is formed to be exposed to the outside of the semiconductor package, and is formed along the four sides of the chip pad in a rectangular shape.

5. The semiconductor package of claim 1, wherein the first groove on the first surface of the chip pad is formed in a V-like shape or a U-like shape.

6. The semiconductor package of claim 1, wherein the first groove on the first surface of the chip pad is formed along the outline of a chip mount area on the first surface of the chip pad.

7. The semiconductor package of claim 1, wherein the first groove on the first surface of the chip pad is formed in a rectangular shape.

8. The semiconductor package of claim 1, wherein the plurality of slots are formed in the chip pad of the leadframe surrounding a chip mount area, and the plurality of slots are separated from each other.

9. The semiconductor package of claim 1, wherein wings are formed near the at least one slot in the chip pad of the leadframe, by bending upward and outward a portion of the chip pad.

10. The semiconductor package of claim 9, wherein the wings near the at least one slot in the chip pad of the leadframe are adjacent to a chip mount area.

11. A leadframe comprising:
    a chip pad having a first surface on which a chip is mounted, and a second surface which is opposite to the first surface and is partially exposed to the outside of the semiconductor package; and
    a plurality of leads extending out from the chip pad, a portion of the leads being molded with an epoxy mold compound (EMC) and the other portion of the leads extending outside a semiconductor package,
    wherein the chip pad of the leadframe includes:
       at least two swaged portions along the edge of the chip pad;
       a narrow and long groove formed along the edge of the second surface of the chip pad to be exposed to the outside of the semiconductor package; and
       at least one slot formed in the chip pad.

12. The leadframe of claim 11, wherein the swaged portions are formed on the second surface of the chip pad.

13. The leadframe of claim 11, wherein the groove on the second surface of the chip pad is formed in a V-like shape or a U-like shape.

14. The leadframe of claim 11, wherein the groove on the second surface of the chip pad is formed along the four sides of the chip pad in a rectangular shape.

15. The leadframe of claim 11, further comprising a narrow and long groove in a V-like shape or a U-like shape on the first surface of the chip pad.

16. The leadframe of claim 15, wherein the groove on the first surface of the chip pad is formed in a rectangular shape.

17. The leadframe of claim 11, wherein the plurality of slots are formed in the chip pad of the leadframe surrounding a chip mount area, and the plurality of slots are separated from each other.

18. The leadframe of claim 11, wherein wings are formed near the at least one slot in the chip pad of the leadframe, by bending upward and outward a portion of the chip pad.

19. The leadframe of claim 18, wherein the wings near the at least one slot in the chip pad of the leadframe are adjacent to a chip mount area.

* * * * *